(12) United States Patent
Park et al.

(10) Patent No.: US 9,755,079 B2
(45) Date of Patent: Sep. 5, 2017

(54) SEMICONDUCTOR DEVICES INCLUDING INSULATING GATES AND METHODS FOR FABRICATING THE SAME

(71) Applicants: Sang-Jine Park, Yongin-si (KR); Keun-Hee Bai, Incheon (KR); Kyoung-Hwan Yeo, Seoul (KR); Bo-Un Yoon, Seoul (KR); Kee-Sang Kwon, Seoul (KR); Do-Hyoung Kim, Hwaseong-si (KR); Ha-Young Jeon, Hwaseong-si (KR); Seung-Seok Ha, Hwaseong-si (KR)

(72) Inventors: Sang-Jine Park, Yongin-si (KR); Keun-Hee Bai, Incheon (KR); Kyoung-Hwan Yeo, Seoul (KR); Bo-Un Yoon, Seoul (KR); Kee-Sang Kwon, Seoul (KR); Do-Hyoung Kim, Hwaseong-si (KR); Ha-Young Jeon, Hwaseong-si (KR); Seung-Seok Ha, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/000,495

(22) Filed: Jan. 19, 2016

(65) Prior Publication Data

US 2016/0268414 A1 Sep. 15, 2016

(30) Foreign Application Priority Data

Feb. 23, 2015 (KR) ........................ 10-2015-0025303

(51) Int. Cl.
*H01L 27/088* (2006.01)
*H01L 29/78* (2006.01)
(Continued)

(52) U.S. Cl.
CPC ........ *H01L 29/785* (2013.01); *H01L 27/0886* (2013.01); *H01L 27/0924* (2013.01);
(Continued)

(58) Field of Classification Search
CPC .............. H01L 29/785; H01L 29/4238; H01L 29/0657; H01L 29/495
See application file for complete search history.

(56) References Cited

U.S. PATENT DOCUMENTS 7,163,865 B2 1/2007 Kim
7,785,969 B2 8/2010 Lee
(Continued)

FOREIGN PATENT DOCUMENTS

KR 10-0855870 8/2008

*Primary Examiner* — Dale E Page
*Assistant Examiner* — Wasiul Haider
(74) *Attorney, Agent, or Firm* — Ward and Smith, P.A.

(57) ABSTRACT

Semiconductor devices are provided including a first active fin extending in a first direction and a second active fin spaced apart from the first active fin in a second direction perpendicular to the first direction, the second active fin extending in the first direction, the second active fin having a longer side shorter than a length of a longer side of the first active fin. A first dummy gate extends in the second direction overlapping a first end of each of the first and second active fins. A first metal gate extends in the second direction intersecting the first active fin and overlapping a second end of the second active fin. A first insulating gate extends in the second direction intersecting the first active fin. The first insulating gate extends into the first active fin.

8 Claims, 20 Drawing Sheets

(51) Int. Cl.
    *H01L 29/49*     (2006.01)
    *H01L 29/423*    (2006.01)
    *H01L 29/06*     (2006.01)
    *H01L 27/092*    (2006.01)
    *H01L 27/12*     (2006.01)

(52) U.S. Cl.
    CPC ...... *H01L 27/1211* (2013.01); *H01L 29/0657* (2013.01); *H01L 29/4238* (2013.01); *H01L 29/495* (2013.01); *H01L 29/7848* (2013.01)

(56)             References Cited

U.S. PATENT DOCUMENTS

| | | |
|---|---|---|
| 8,264,017 B2 | 9/2012 | Banna |
| 8,309,427 B2 | 11/2012 | Fishburn et al. |
| 8,431,466 B2 | 4/2013 | Lin et al. |
| 8,466,034 B2 | 6/2013 | Maszara et al. |
| 8,466,511 B2 | 6/2013 | Oh et al. |
| 8,501,607 B1 | 8/2013 | Juengling |
| 8,609,510 B1 | 12/2013 | Banna et al. |
| 8,735,991 B2 | 5/2014 | Shieh et al. |
| 2014/0027860 A1 | 1/2014 | Glass et al. |
| 2014/0131831 A1* | 5/2014 | Wei .................. H01L 21/77 257/506 |
| 2015/0115373 A1* | 4/2015 | Yu .................. H01L 21/823418 257/401 |

* cited by examiner

1400

SEMICONDUCTOR DEVICES INCLUDING INSULATING GATES AND METHODS FOR FABRICATING THE SAME

CROSS-REFERENCE TO RELATED APPLICATION

This application claims priority to Korean Patent Application No. 10-2015-0025303 filed Feb. 23, 2015 in the Korean Intellectual Property Office, the contents of which are hereby incorporated herein by reference as if set forth in its entirety.

FIELD

The present inventive concept relates generally to semiconductor devices and, more particularly, to semiconductor devices including insulating gates and methods of fabricating the same.

BACKGROUND

As one of many scaling techniques for increasing the density of semiconductor devices, a multi gate transistor has been proposed, in which a fin- or nanowire-shaped multi-channel active pattern (or silicon body) is formed on a substrate. A gate is formed on a surface of the multi-channel active pattern.

Since the multi gate transistor uses a three-dimensional channel, scaling of the multi gate transistor can be performed with ease. Furthermore, current controlling capability can be improved without increasing the gate length of the multi gate transistor. A short channel effect (SCE) in which an electric potential of a channel region is affected by a drain voltage, may be effectively suppressed.

SUMMARY

Some embodiments of the present inventive concept provide a semiconductor device including a first active fin extending in a first direction and a second active fin spaced apart from the first active fin in a second direction perpendicular to the first direction, the second active fin extending in the first direction, the second active fin having a longer side shorter than a length of a longer side of the first active fin. A first dummy gate extends in the second direction overlapping a first end of each of the first and second active fins. A first metal gate extends in the second direction intersecting the first active fin and overlapping a second end of the second active fin. A first insulating gate extends in the second direction intersecting the first active fin. The first insulating gate extends into the first active fin.

Further embodiments of the present inventive concept provide a semiconductor device including a first active fin extending in a first direction, a second active fin spaced apart from the first active fin in a second direction perpendicular to the first direction, the second active fin extending in the first direction, and a first dummy gate extending in the second direction overlapping a first end of each of the first and second active fins. A first normal gate extends in the second direction overlapping the first and second active fins. An insulating gate extends in the second direction overlapping the first active fin but not the second active fin. The insulating gate extends into the first active fin.

Still further embodiments of the present inventive concept provide a semiconductor device including a first active fin extending in a first direction, a second active fin spaced apart from the first active fin in the first direction, the second active fin extending in the first direction. A first dummy gate extends in a second direction perpendicular to the first direction overlapping a first end of the first active fin. A second dummy gate extends in the second direction overlapping a second end of the second active fin facing one end of the first active fin. A first normal gate extends in the second directing intersecting the first active fin. A first insulating gate extends in the second direction intersecting the first active fin. A second normal gate extends in the second direction intersecting the second active fin, and a second insulating gate extends in the second direction intersecting the second active fin. The first insulating gate extends into the first active fin and the second insulating gate extends into the second active fin.

Some embodiments of the present inventive concept provide a semiconductor device including a first active fin on a substrate, the first active fin extending in a first direction. A device isolation layer extends in a second direction, different from the first direction, the device isolation layer intersecting the first active fin to define the first active fin and a second active fin. The first and second active fins extend in a first direction and are spaced apart from each other in the first direction. A metal gate intersects the first active fin and an insulating gate intersects the first active region. The insulating gate extends into the first active fin.

Further embodiments of the present inventive concept provide methods for fabricating a semiconductor device including forming an active fin on a substrate, the active fin extending in a first direction; forming a device isolating layer extending in a second direction intersecting the active fin and separating the active fin into first and second active fins spaced apart from each other in the first direction; forming first and second dummy gates intersecting the first active fin; forming a third dummy gate overlapping a first end of the first active fin; forming a fourth dummy gate overlapping a second end of the second active fin facing the first end of the first active fin; replacing the first dummy gate by a metal gate; and replacing the second dummy gate by an insulating gate, wherein the insulating gate extends into the first active fin.

DETAILED DESCRIPTION OF THE EMBODIMENTS

Figure 1:
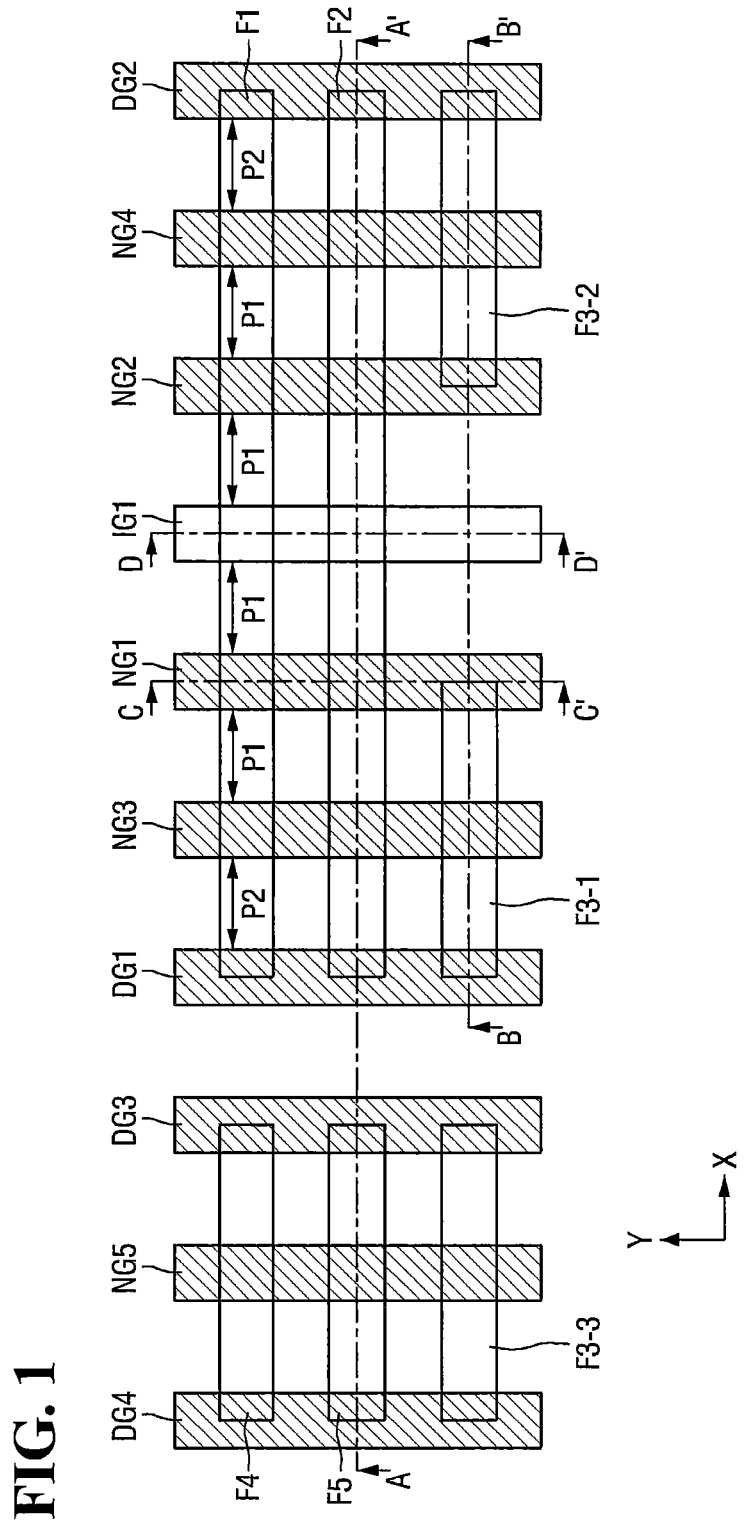
FIG. 1 is a layout diagram illustrating a semiconductor device according to some embodiments of the present inventive concept.

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 2:
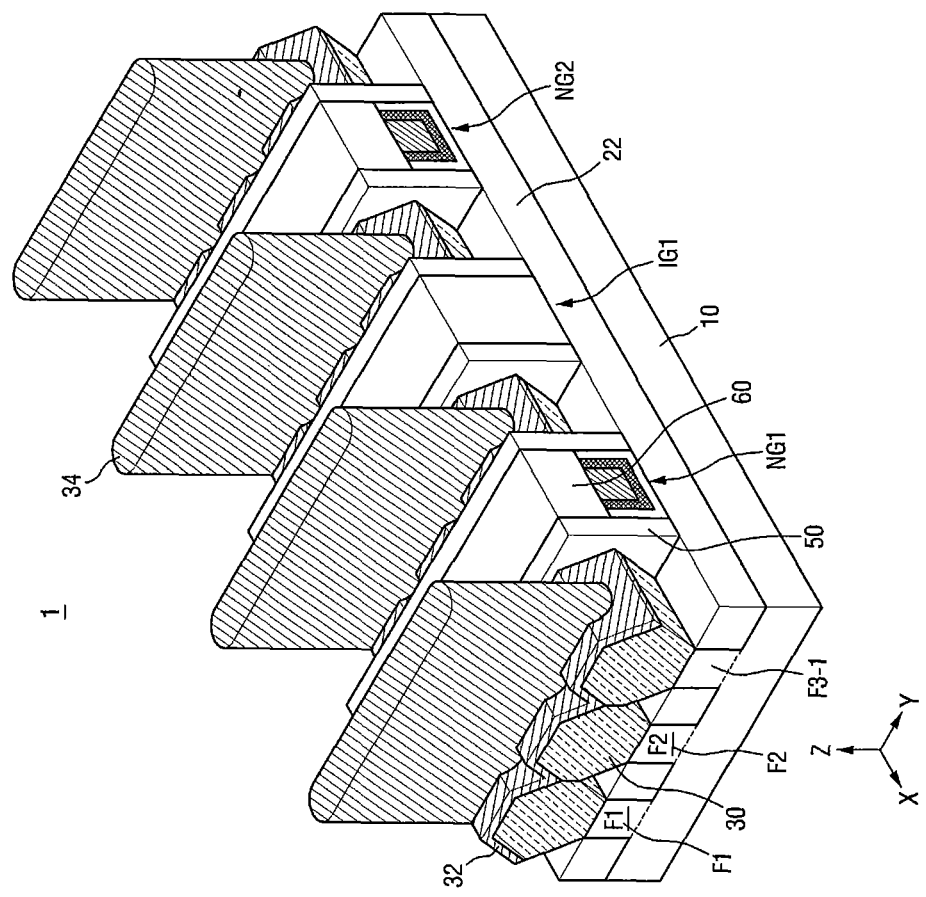
FIG. 2 is a perspective view illustrating first and second normal gates and a first insulating gate in accordance with some embodiments of the present inventive concept.
Figure 3:
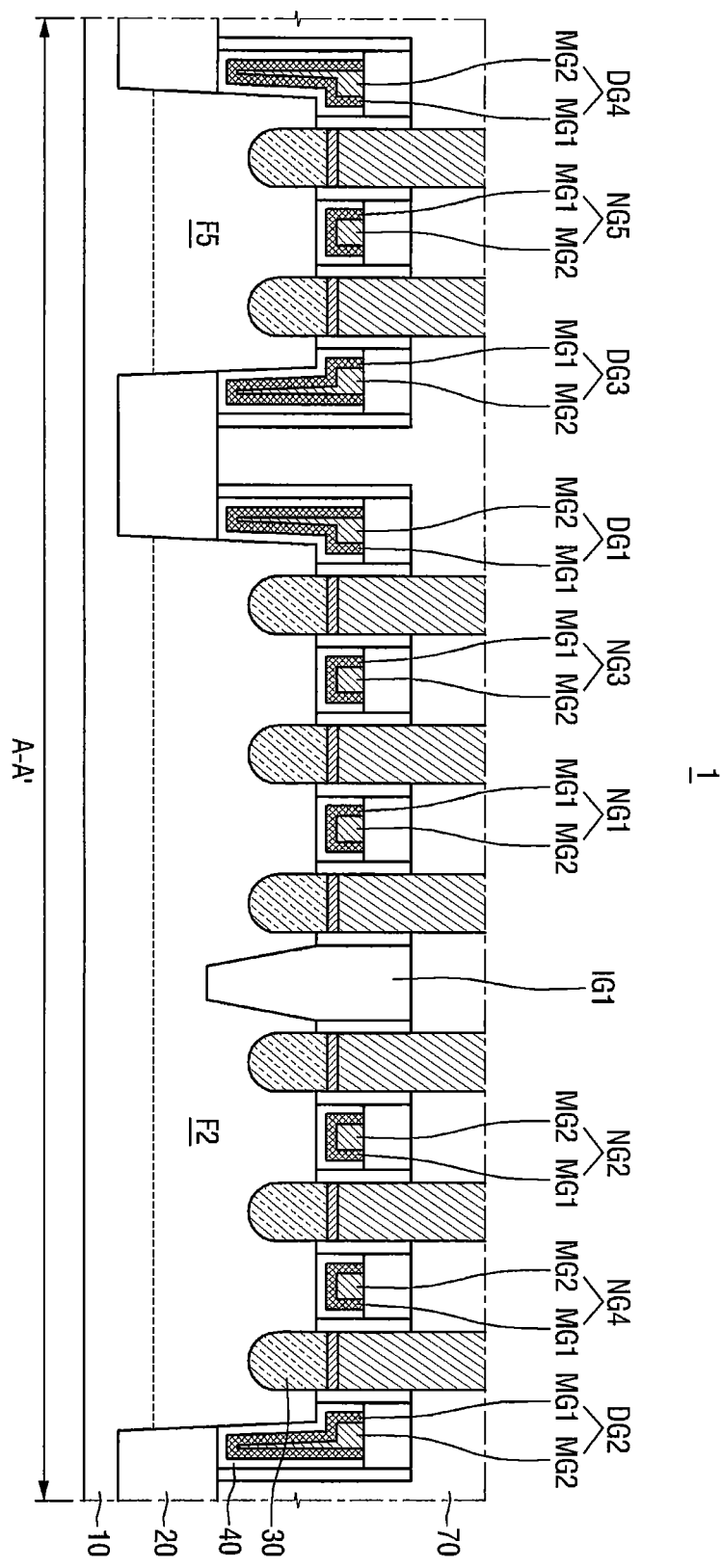
FIG. 3 is a cross-section taken along the line A-A' of FIG. 1.
Figure 4:
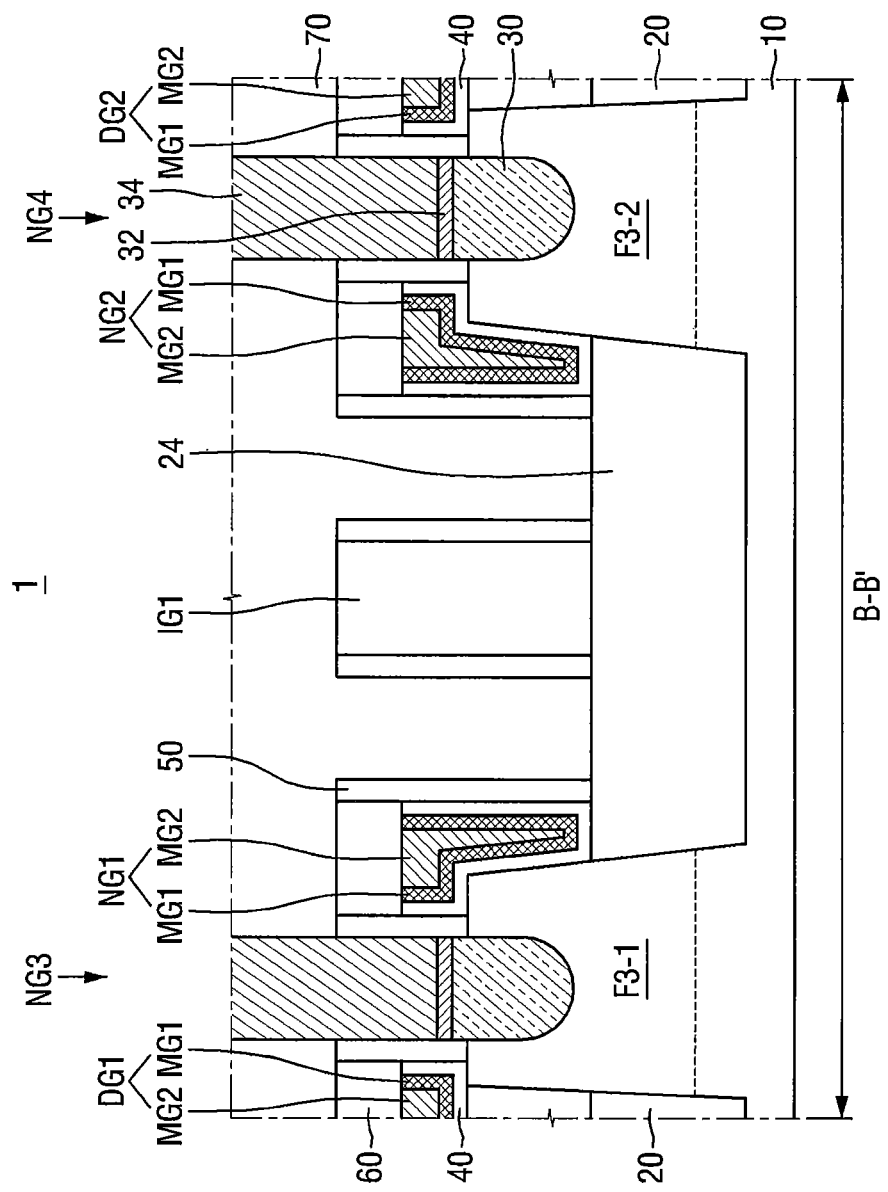
FIG. 4 is a cross-section taken along the line B-B' of FIG. 1.
Figure 5:
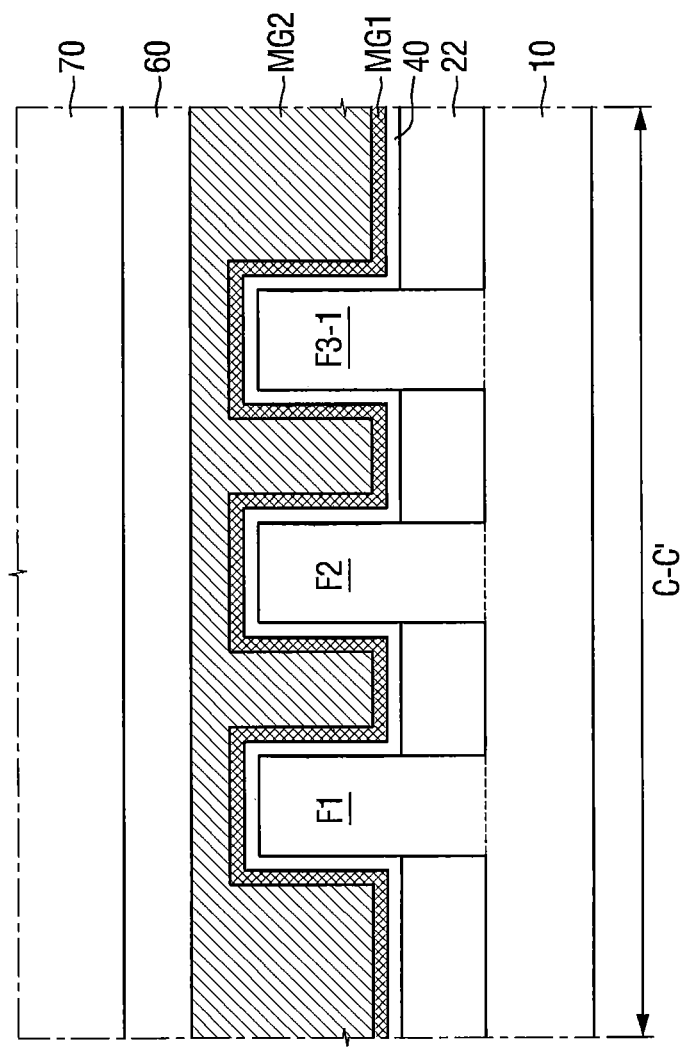
FIG. 5 is a cross-section taken along the line C-C' of FIG. 1.
Figure 6:
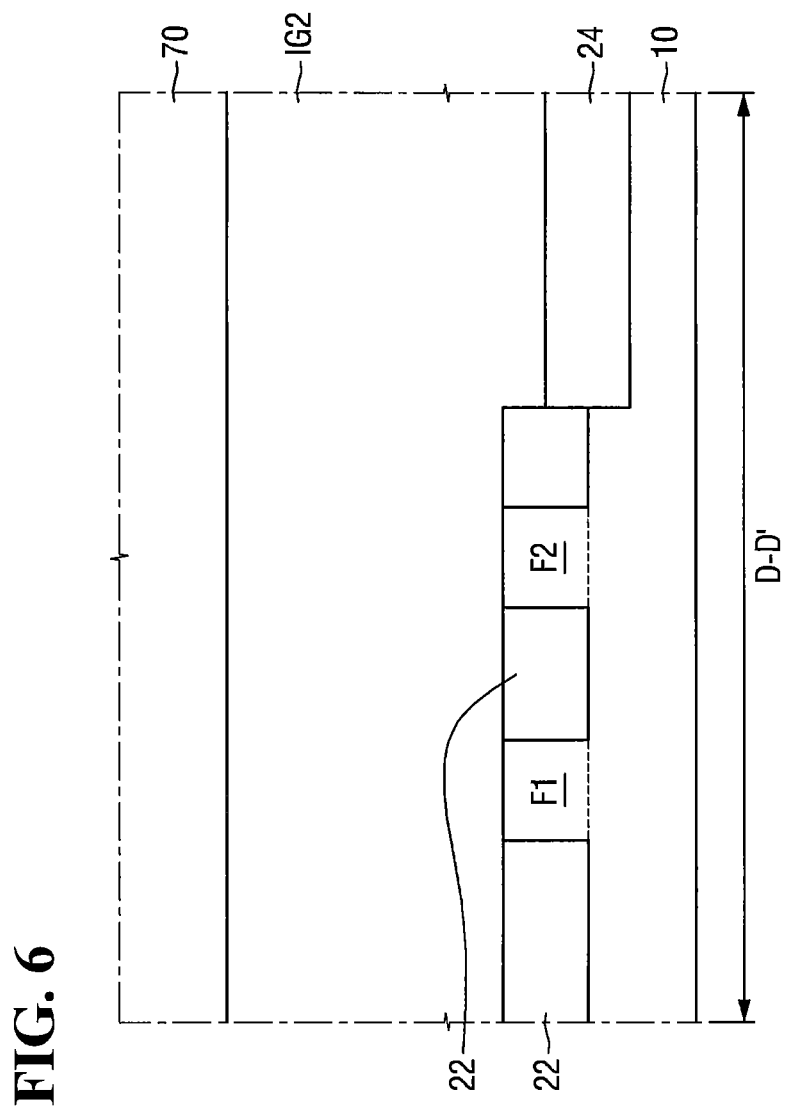
FIG. 6 is a cross-section taken along the line D-D' of FIG. 1.

FIG. 1 is a layout diagram of a semiconductor device according to some embodiments of the present inventive concept. FIG. 2 is a perspective view of first and second normal gates and a first insulating gate. FIG. 3 is a cross-section taken along the line A-A' of FIG. 1. FIG. 4 is a cross-section taken along the line B-B' of FIG. 1. FIG. 5 is a cross-section taken along the line C-C' of FIG. 1. FIG. 6 is a cross-section taken along the line D-D' of FIG. 1.

Referring to FIGS. 1 to 6, a semiconductor device 1 includes active fins F1, F2, F3-1, F3-2, F3-3, F4 and F5, dummy gates DG1 to DG4, normal gates NG1 to NG5, an insulating gate IG1 and a first device isolating layer 20.

Active fins F1, F2, F3-1, F3-2, F3-3, F4 and F5 may protrude from a substrate 10 and extend in a first direction X. The substrate 10 may include a semiconductor material. The semiconductor material may include one or more of, for example, Si, Ge, SiGe, GaP, GaAs, SiC, SiGeC, InAs and InP.

However, it will be understood that embodiments of the present inventive concept are not limited to this configuration, for example, the substrate 10 may be an insulating substrate in some embodiments without departing from the scope of the present inventive concept. In other words, the substrate 10 may be, for example, a silicon on insulator (SOI) substrate. When the substrate 10 is a SOI substrate, the semiconductor device may have improved response speed.

As illustrated in the Figures, active fins F1, F2, F3-1, F3-2, F3-3, F4 and F5 may be arranged on the substrate 10 such that the active fins are spaced apart from each other in the first direction X and second direction Y for example.

In particular, the active fin F1 may be spaced apart from the active fin F2 in the second direction Y. Furthermore, the active fin F2 may be spaced apart from the active fins F3-1, F3-2 and F3-3 in the second direction Y.

The active fin F4 may be spaced apart from the active fin F1 in the first direction X. The active fin F5 may be spaced apart from the active fin F2 in the first direction X.

The active fin F3-3 may be spaced apart from the active fin F3-2 in the first direction X. The active fin F3-2 may be spaced apart from the active fin F3-1 in the first direction X. Each of the active fins F1, F2, F3-1, F3-2, F3-3, F4 and F5 may have a longer side and a shorter side.

Although the active fins F1, F2, F3-1, F3-2, F3-3, F4 and F5 are depicted in FIG. 1 as having longer sides arranged in the first direction X and shorter sides arranged in the second direction Y, it will be understood that embodiments of the present inventive concept are not limited to this configuration. For example, in some embodiments of the present inventive concept, the longer sides of the active fins F1, F2, F3-1, F3-2, F3-3, F4 and F5 may be arranged in the second direction Y, and the shorter sides of the active fins F1, F2, F3-1, F3-2, F3-3, F4 and F5 may be arranged in the first direction X.

The active fin F3-1 may have a longer side which is shorter than the longer side of the active fin F1 or active fin F2. In other words, the length of the active fin F3-1 in the first direction X may be shorter than the length of the active fin F1 or active fin F2 in the first direction X.

The active fin F3-2 which is spaced apart from the active fin F3-1 in the first direction X may also have a longer side shorter than the longer side of the active fin F1 or active fin F2. In other words, the length of the active fin F3-2 in the first direction X may be shorter than the length of the active fin F1 or active fin F2 in the first direction X.

The active fins F1, F2, F3-1, F3-2, F3-3, F4 and F5 may be a part of the substrate 1Q, or may include an epitaxial layer grown from the substrate 10.

In some embodiments of the present inventive concept, the active fins F1, F2, F3-1, F3-2, F3-3, F4 and F5 may include a semiconductor material. The active fins F1, F2, F3-1, F3-2, F3-3, F4 and F5 may include, for example, Si, Site or the like.

In some embodiments of the present inventive concept, the active fins F1, F2, F3-1, F3-2, F3-3, F4 and F5 may include a material the same or similar to the material of the substrate 10. For example, when the substrate 10 includes. Si, the active fins F1, F2, F3-1, F3-2, F3-3, F4 and F5 may also include Si.

However, it will be understood that embodiments of the present inventive concept are not limited to this configuration. For example, the substrate 10 and the active fins F1, F2, F3-1, F3-2, F3-3, F4 and F5 may include materials different from each other without departing from the scope of the present inventive concept.

For example, if the substrate 10 includes Si, the active fins F1, F2, F3-1, F3-2, F3-3, F4 and F5 may include a semiconductor material different from Si. In these embodiments, the active fins F1, F2, F3-1, F3-2, F3-3, F4 and F5 may be formed on the substrate 10 using, for example, an epitaxial growth process.

A field insulating layer 22 may be formed on the substrate 10 to cover at least a portion of side walls of the active fins F1, F2, F3-1, F3-2, F3-3, F4 and F5 and expose upper portions of the active fins F1, F2, F3-1, F3-2, F3-3, F4 and F5.

As illustrated in the figures, the field insulating layer 22 may extend in the first direction X along the longer sides of the active fins F1, F2, F3-1, F3-2, F3-3, F4 and F5.

In some embodiments of the present inventive concept, the field insulating layer 22 may include any one of an oxide film, an oxynitride film and a nitride film, for example, however, the present inventive concept is not limited thereto.

The first device isolating layer 20 may extend at both sides of each of the active fins F1, F2, F3-1, F3-2, F3-3, F4 and F5 in the second direction Y along the shorter sides of each of the active fins F1, F2, F3-1, F3-2, F3-3, F4 and F5. As illustrated in the figures, the first device isolating layer and the field insulating layer 22 may intersect each other in a region where the longer sides and shorter sides of the active fins F1, F2, F3-1, F3-2, F3-3, F4 and F5 intersect each other.

In some embodiments of the present inventive concept, the first device isolating layer 20 may have a lower surface disposed lower than an upper surface of the substrate 10. Furthermore, the lower surface of the first device isolating layer 20 may be disposed lower than lower surfaces of the active fins F1, F2, F3-1, F3-2, F3-3, F4 and F5.

In some embodiments of the present inventive concept, the first device isolating layer 20 may have an upper surface formed lower than upper surfaces of the active fins F1, F2, F3-1, F3-2, F3-3, F4 and F5. However, the present inventive concept is not limited thereto, and the upper surface of the first device isolating layer 20 may be formed higher than the upper surfaces of the active fins F1, F2, F3-1, F3-2, F3-3, F4 and F5, or may be formed to have a height substantially similar to or the same as the height of the upper surfaces of the active fins F1, F2, F3-1, F3-2, F3-3, F4 and F5 as needed.

In some embodiments of the present inventive concept, the first device isolating layer 20 may include an insulating film. In particular, the first device isolating layer 20 may include any one of an oxide film, an oxynitride film and a nitride film. It will be understood that embodiments of the present inventive concept are not limited thereto.

A second device isolating layer 24 may be positioned between the active fin F3-1 and the active fin F3-2.

In some embodiments of the present inventive concept, the second device isolating layer 24 may have a lower surface formed lower than the lower surface of the substrate 10. Furthermore, the lower surface of the second device isolating layer 24 may be formed lower than lower surfaces of the active fins F1, F2, F3-1, F3-2, F3-3, F4 and F5.

In some embodiments of the present inventive concept, the second device isolating layer 24 may have an upper surface formed lower than the upper surfaces of the active fins F1, F2, F3-1, F3-2, F3-3, F4 and F5. However, embodiments of the present inventive concept are not limited thereto, and the upper surface of the second device isolating layer 24 may be formed higher than the upper surfaces of the active fins F1, F2, F3-1, F3-2, F3-3, F4 and F5, or may be formed to have a height substantially same as the height of the upper surfaces of the active fins F1, F2, F3-1, F3-2, F3-3, F4 and F5 as needed without departing from the scope of the present inventive concept.

In some embodiments of the present inventive concept, the second device isolating layer 24 may include an insulating film. In particular, the second device isolating layer 24 may include any one of an oxide film, an oxynitride film and a nitride film, for example, however, the present inventive concept is not limited thereto.

The second device isolating layer 24 provide electrical insulation between the active fin F3-1 and the active fin F3-2.

The normal gates NG1 to NG5 may extend on the active fins F1, F2, F3-1, F3-2, F3-3, F4 and F5 in the second direction Y perpendicular to the first direction X in which the active fins F1, F2, F3-1, F3-2, F3-3, F4 and F5 extend.

Although the normal gates NG1 to NG5 are depicted in FIG. 1 as being extended in the second direction Y, the present inventive concept is not limited thereto. In some embodiments of the present inventive concept, the normal gates NG1 to NG5 may intersect the active fins F1, F2, F3-1, F3-2, F3-3, F4 and F5 while forming an acute angle or an obtuse angle with the active fins F1, F2, F3-1, F3-2, F3-3, F4 and F5.

As illustrated in the figures, the normal gates NG1 to NG5 may be spaced apart from each other in the first direction X. In some embodiments of the present inventive concept, the normal gates NG1 to NG5 may include a metal gate. In particular, the normal gates NG1 to NG5 may include a first metal layer MG1 and a second metal layer MG2. In some embodiments of the present inventive concept, the normal gates NG1 to NG5 may be formed of the first metal layer MG1 and second metal layer MG2 stacked into two or more layers.

The first metal layer MG1 may serve to adjust a work function, and the second metal layer MG2 may fill the space formed by the first metal layer MG1.

As shown in FIG. 3, the first metal layer MG1 may be formed into a shape extending upwardly along an upper surface of a gate insulating layer 40 and side surfaces of the second metal layer MG2.

Furthermore, as shown in FIG. 5, the first metal layer MG1 may conformally extend in the second direction Y along an upper surface of the field insulating layer 22, and side walls and upper surfaces of the active fins F1, F2, F3-1, F3-2, F3-3, F4 and F5.

The first metal layer MG1 may include, for example, at least one of TiN, TaN, TiC, TiAlC and TaC. The second metal layer MG2 may include, for example, W or Al. However, the present inventive concept is not limited thereto. For example, the first metal layer MG1 and the second metal layer MG2 may be formed of materials different from the above-mentioned materials without departing from the scope of the present inventive concept.

The normal gates NG1 to NW may be formed using, for example, a gate replacement process; however, the present inventive concept is not limited thereto.

Meanwhile, in some embodiments of the present inventive concept, the normal gates NG1 to NG5 may be formed of a material which is not metal, for example, Si, SiGe and the like.

As illustrated in FIG. 1, the normal gate NG1 may intersect the active fins F1 and F2 and may be overlapped with the other end of the active fin F3-1 (for example, a right end of the active fin F3-1 in FIG. 1), the active fin F3-1 having one end and the other end. The normal gate NG2 may intersect the active fins F1 and F2 and may be overlapped with one end of the active fin F3-2 (for example, a left end of the active fin F3-2 in FIG. 1). The normal gate NG3 may intersect the active fins F1, F2 and F3-1, and the normal gate NG4 may intersect the active fins F1, F2 and F3-2. The normal gate NG5 may intersect the active fins F4, F5 and F3-3.

The gate insulating layer 40 may be formed beneath the normal gates NG1 to NG5. The gate insulating layer may include a high dielectric material having a dielectric constant higher than that of a silicon oxide film. For example, the gate insulating layer 40 may include $HfO_2$, $ZrO_2$, LaO, $Al_2O_3$, $Ta2O_5$ or the like, however, the present inventive concept is not limited thereto.

As shown in FIG. 3, the gate insulating layer 40 may be formed into a shape extending upwardly along upper surfaces of the active fins F2 and F5 and side surfaces of the normal gates NG1 to NG5.

Further, as illustrated in FIG. 5, the gate insulating layer 40 may extend in the second direction Y along an upper surface of the field insulating layer 22 and side surfaces and upper surfaces of the active fins F1, F2 and F3-1.

A spacer 50 may be formed on at least one side of each of the normal gates NG1 to NG5. In some embodiments of the present inventive concept, the spacer 50 may be formed at both sides of each of the normal gates NG1 to NG5.

Although an I-type spacer 50 is depicted in the drawings, the present inventive concept is not limited thereto. In some embodiments of the present inventive concept, the spacer 50 may vary in shape without departing from the scope of the present inventive concept.

In some embodiments, the spacer 50 may include, for example, a nitride film. In some embodiments, the spacer 50 may include a silicon nitride film.

However, the present inventive concept is not limited thereto, and the material of the spacer 50 may vary without restriction. For example, in some embodiments of the present inventive concept, the spacer 50 may include either an oxide film or an oxynitride film.

A capping layer 60 may be provided on the normal gates NG1 to NG5. The capping layer 60 may extend in the second direction Y.

The capping layer 60 may have an upper surface arranged to be substantially coplanar with an upper surface of the spacer 50. In other words, the upper surface of the capping layer 60 may have a height substantially same as the height of the upper surface of the spacer 50.

The capping layer 60 may include, for example, at least either a silicon nitride film or a silicon oxynitride film. However, the present inventive concept is not limited thereto, and the material of the capping layer 60 may vary. In addition, in some embodiments of the present inventive concept, the capping layer 60 may be omitted as needed.

A source/drain region 30 may be arranged at both sides of each of the normal gates NG1 to NG5. The source/drain region 30 may be arranged within each of the active fins F1, F2, F3-1, F3-2, F3-3, F4 and F5. In other words, the source/drain region 30 may be formed in an etched part of each of the active fins F1, F2, F3-1, F3-2, F3-3, F4 and F5.

Although the source/drain regions 30 are depicted in FIG. 2 as contacting each other in the second direction Y, the present inventive concept is not limited thereto. For example, the source/drain regions 30 may be spaced apart from each other in the second direction Y without departing from the scope of the present inventive concept.

In some embodiments of the present inventive concept, the source/drain region 30 may be an elevated source/drain region. Thus, the source/drain region 30 may have an upper surface higher than the upper surfaces of the active fins F1, F2, F3-1, F3-2, F3-3, F4 and F5.

When the semiconductor device 1 is a PMOS transistor, the source/drain region 30 may include a compressive stress material. For example, the compressive stress material may have a lattice constant larger than that of Si, and may be, for example, SiGe. The compressive stress material may apply compressive stresses to the active fins F1, F2, F3-1, F3-2, F3-3, F4 and F5 provided beneath the normal gates NG1 to NG5, that is, to a channel region, so as to improve carrier mobility of the channel region.

Meanwhile, when the semiconductor device 1 is an NMOS transistor, the source/drain region 30 may include a material same as the material of the substrate 10, or a tensile stress material. For example, when the substrate 10 is formed of Si, the source/drain region 30 may also be formed of Si or a material having a lattice constant smaller than that of Si (for example, SiC or SiP). The tensile stress material may apply tensile stresses to the active fins F1, F2, F3-1, F3-2, F3-3, F4 and F5 provided beneath the normal gates NG1 to NG5, that is, to a channel region, so as to improve carrier mobility of the channel region.

In some embodiments of the present inventive concept, the source/drain region 30 may be formed using an epitaxial growth process; however, the present inventive concept is not limited thereto.

A silicide layer 32 may be formed on the source/drain region 30. The silicide layer 32 may be formed along the upper surface of the source/drain region 30. The silicide layer 32 may serve to reduce sheet resistance, contact resistance and the like when the source/drain region 30 is brought into contact with a contact 34. The silicide layer 32 may include a conductive material, for example, Pt, Ni, Co and the like.

The contact 34 may be formed on the silicide layer 32. The contact 34 may be formed of a conductive material. The contact 34 may include, for example, W, Al Cu and the like; however, the present inventive concept is not limited thereto.

An interlayer insulating layer 70 may cover the spacer 50 and the capping layer 60. The contact 34 may penetrate through the interlayer insulating layer 70.

The dummy gates DG1 to DG4 may extend in the second direction Y on the first device isolating layer 20.

In particular, the dummy gate DG1 may extend in the second direction Y to be overlapped with one end of each of active fins F1, F2 and F3-1 (for example, a left end of each of active fins F1, F2 and F3-1 in FIG. 1) on the first device isolating layer 20. The dummy gate DG2 may extend in the second direction Y to be overlapped with the other end of each of active fins F1, F2 and F3-2 (for example, a right end of each of active fins F1, F2 and F3-2 in FIG. 1) on the first device isolating layer 20. The dummy gate DG3 may extend in the second direction Y to be overlapped with one end of each of active fins F4, F5 and F3-3 (for example, a left end of each of active fins F4, F5 and F3-3 in FIG. 1) on the first device isolating layer 20. The dummy gate DG4 may extend in the second direction Y to be overlapped with the other end of each of active fins F4, F5 and F3-3 (for example, a right end of each of active fins F4, F5 and F3-3 in FIG. 1) on the first device isolating layer 20.

Although the dummy gates DG1 to DG4 are depicted in FIG. 1 as extending in the second direction Y, the present inventive concept is not limited thereto. In some embodiments, the dummy gates DG1 to DG4 may extend in the direction in which the dummy gates DG1 to DG4 may form an acute angle or an obtuse angle with the active fins F1, F2, F3-1, F3-2, F3-3, F4 and F5 without departing from the scope of the present inventive concept.

In these embodiments, the dummy gates DG1 to DG4 may have a construction substantially same as the construction of the normal gates NG1 to NG5 described above. In other words, each of the dummy gates DG1 to DG4 may include a metal gate including the first metal layer MG1 and the second metal layer MG2.

However, the present inventive concept is not limited thereto, and in some other embodiments of the present inventive concept, at least one of the dummy gates DG1 to DG4 may include a mask including a silicon nitride film and a polysilicon gate including, for example, polysilicon.

When an upper surface of the first device isolating layer 20 is arranged lower than the upper surfaces of the active fins F1, F2, F3-1, F3-2, F3-3, F4 and F5, lower surfaces of the dummy gates DG1 to DG4 may be arranged lower than the upper surfaces of the active fins F1, F2, F3-1, F3-2, F3-3, F4 and F5 as illustrated in the figures.

Accordingly, the lower surface of at least one of the gate insulating film 4Q, the first metal layer MG1 and the second metal layer MG2 included in the dummy gates DG1 to DG4 may be arranged lower than the upper surfaces of the active fins F1, F2, F3-1, F3-2, F3-3, F4 and F5.

The insulating gate IG1 may extend in the second direction Y on the active fins F1 and F2. The insulating gate IG1 may be overlapped with the active fins F1 and F2 and may not be overlapped with the active fins F3-1 and F3-2 as illustrated in the figures.

In some embodiments of the present inventive concept, a first pitch P1 between the insulating gate IG1 and the normal gate (for example, NG1) may be different from a second pitch P2 between the normal gate (for example, NG3) and the dummy gate (for example, DG1).

In particular, the first pitch P1 between the insulating gate IG1 and the normal gate (for example, NG1) may be smaller than the second pitch P2 between the normal gate (for example, NG3) and the dummy gate (for example, DG1).

The first pitch P1 between the insulating gate IG1 and the normal gate (for example, NG1) may be smaller than the second pitch P2 between the normal gate (for example, NG3) and the dummy gate (for example, DG1) as mentioned above, because the insulating gate IG1 according to these embodiments may be formed using a gate replacement process.

The insulating gate IG1 may include an insulating film extending into the active fins F1 and F2 as illustrated in the figures.

In some embodiments of the present inventive concept, the insulating gate IG1 may have a lower surface arranged higher than the lower surfaces of the active fins F1 and F2. In addition, the lower surface of the insulating gate IG1 may be arranged higher than the lower surface of the first device isolating layer 20.

Furthermore, in some embodiments of the present inventive concept, the insulating gate IG1 may have a width narrower than the width of the first device isolating layer 20. However, the present inventive concept is not limited thereto, and this relationship may be modified according to embodiments without departing from the scope of the present inventive concept.

The insulating gate IG1 may be provided on the second device isolating layer 24 between the active fin F3-1 and the active fin F3-2.

The insulating gate IG1 may serve to achieve electrical insulation between adjacent normal gates NG1 and NG2.

In some embodiments, since the insulating gate IG1 may be formed using a gate replacement process, the spacer 50 may extend in the second direction Y on at least one side of the insulating gate IG1 as illustrated in the figures.

As discussed above, in the semiconductor device according to some embodiments, the first and second device isolating layers 20 and 24 may achieve electrical insulation among the active fins F1, F2, F3-1, F3-2, F3-3, F4 and F5, and the insulating gate IG1 may achieve electrical insulation between the normal gates NG1 and NG2. Thus, the semiconductor device 1 may have improved operating reliability.

Figure 7:
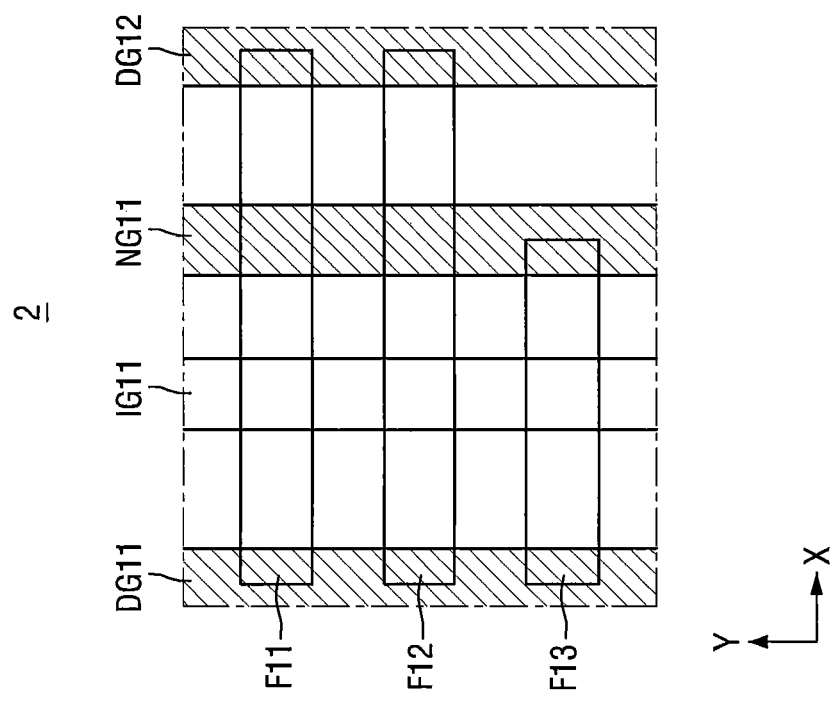
FIG. 7 is a layout diagram illustrating a semiconductor device according to some embodiments of the present inventive concept.

FIG. 7 is a layout diagram of a semiconductor device according to some embodiments of the present inventive concept. Like numerals refer to like elements throughout. Thus, only difference between these embodiments and the embodiments discussed above will be discussed in the interest of brevity.

Referring to FIG. 7, a semiconductor device 2 in accordance with some embodiments is different from the semiconductor device of the aforementioned embodiments in the arrangement of active fins F11, F12 and F13, dummy gates DG11 and DG12, a normal gate NG11 and an insulating gate IG11.

In particular, the active fin F11 may extend in the first direction X, and the active fin F12 may be spaced apart from the active fin F11 in the second direction Y and extend in the first direction X. The length of a longer side of the active fin F11 and the length of a longer side of the active fin F12 may be substantially the same.

The active fin F13 may be spaced apart from the active fin F12 in the second direction Y and extend in the first direction X. The active fin F13 may have a longer side with a length that may be different from the length of the longer side of the active fin F11 and the length of the longer side of the active fin F12. In particular, the length of the longer side of the active fin F13 may be shorter than the length of the longer side of the active fin F11 and the length of the longer side of the active fin F12.

The dummy gate DG11 may extend in the second direction Y to be overlapped with one end of each of the active fins F11 to F13 (for example, a left end of each of the active fins F11 to F13 in FIG. 7). The dummy gate DG12 may extend in the second direction Y to be overlapped with the other end of each of the active fins F11 and F12 (for example, a right end of each of the active fins F11 and F12 in FIG. 7). The dummy gate DG12 may not be overlapped with the active fin F13 as illustrated in the figures.

The normal gate NG11 may extend in the second direction Y to intersect the active fins F11 and F12 and to be overlapped with the other end of the active fin F13 (for example, a right end of the active fin F13 in FIG. 7).

The insulating gate IG11 may extend in the second direction Y to intersect the active fins F11 to F13.

Figure 8:
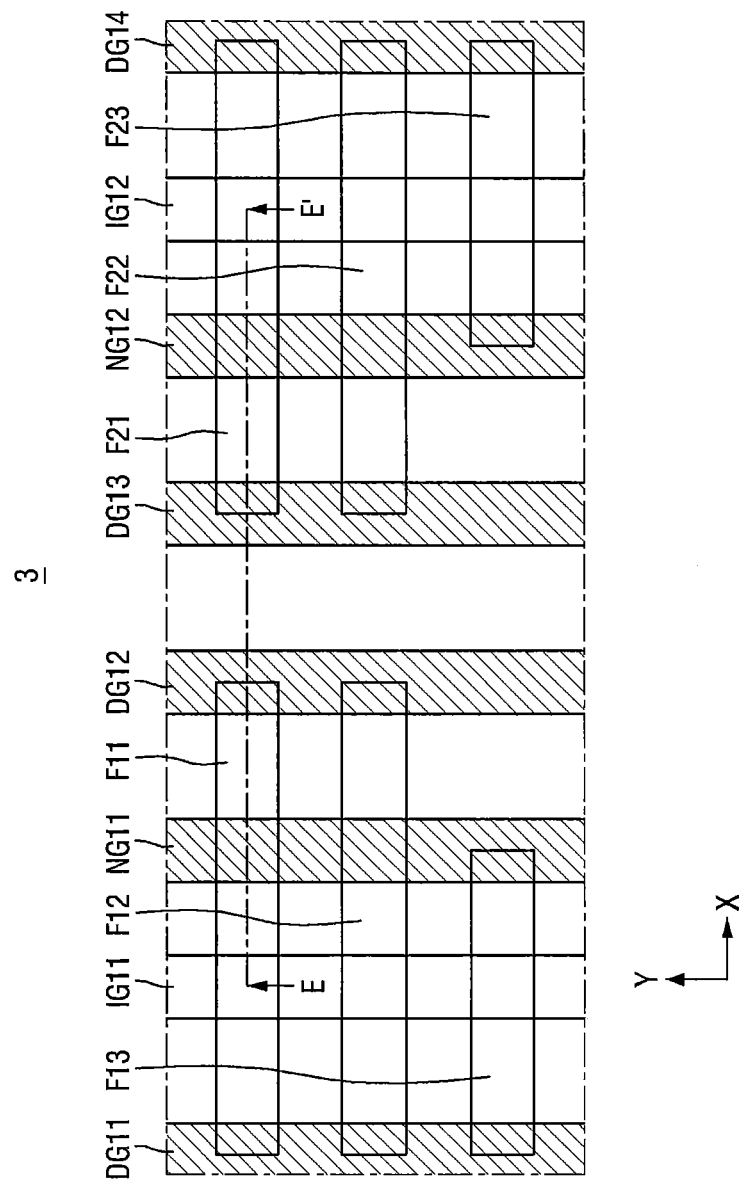
FIG. 8 is a layout diagram of a semiconductor device according to some embodiments of the present inventive concept.
Figure 9:
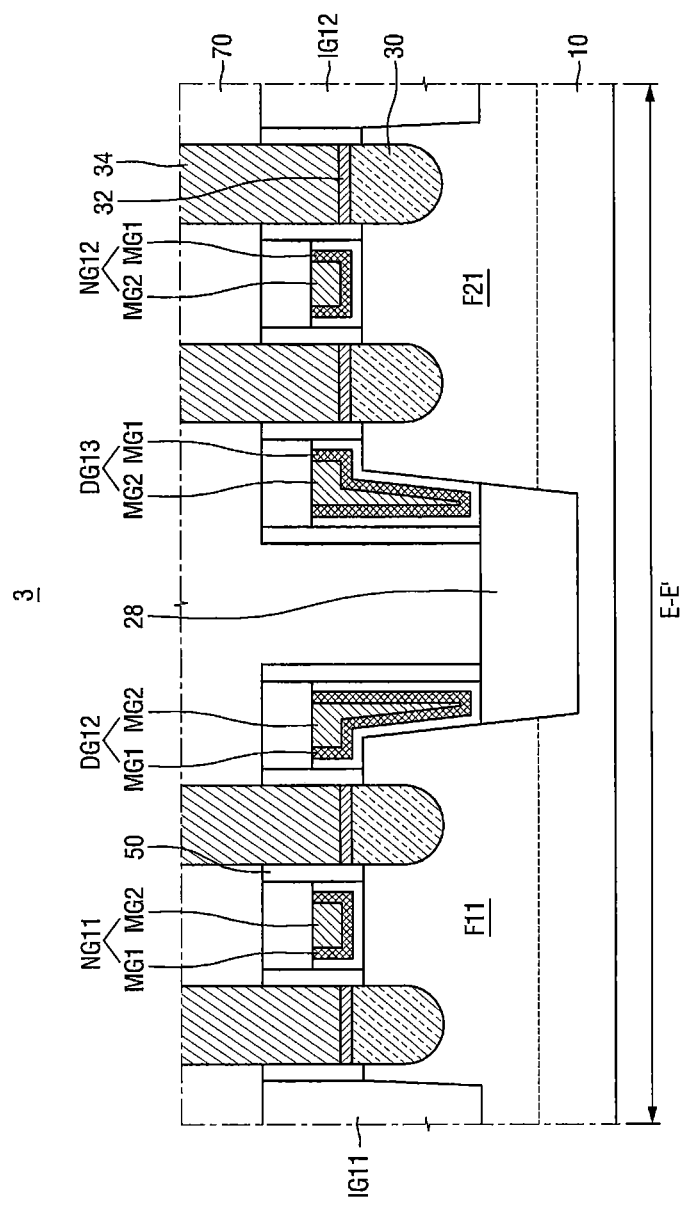
FIG. 9 is a cross-section taken along the line E-E' of FIG. 8.

FIG. 8 is a layout diagram of a semiconductor device according to some embodiments of the present inventive concept. FIG. 9 is a cross-section taken along the line E-E' of FIG. 8. Like numerals refer to like elements throughout. Thus, only differences between these embodiments and the aforementioned embodiments will be discussed in the interest of brevity.

Referring to FIGS. 8 and 9, a semiconductor device 3 according to some embodiments may further include active fins F21, F22 and F23, dummy gates DG13 and DG14, a normal gate NG12 and an insulating gate IG12, as compared with the semiconductor device 2 discussed with reference to FIG. 7.

In particular, the active fin F21 may extend in the first direction X, and the active fin F22 may be spaced apart from the active fin F21 in the second direction Y and extend in the first direction X. The length of a longer side of the active fin F21 and the length of a longer side of the active fin F22 may be substantially the same.

The active fin F23 may be spaced apart from the active fin F22 in the second direction Y and extend in the first direction X. The active fin F23 may have a longer side with a length that may be different from the length of the longer side of the active fin F21 and the length of the longer side of the active fin F22. In particular, the length of the longer side of the active fin F23 may be shorter than the length of the longer side of the active fin F21 and the length of the longer side of the active fin F22.

The dummy gate DG14 may extend in the second direction Y to be overlapped with the other end of each of the active fins F21 to F23 (for example, a right end of each of the active fins F21 to F23 in FIG. 8). The dummy gate DG13 may extend in the second direction Y to be overlapped with one end of each of the active fins F21 and F22 (for example, a left end of each of the active fins F21 and F22 in FIG. 8). The dummy gate DG13 may not be overlapped with the active fin F23 as illustrated in the figures.

The normal gate NG12 may extend in the second direction Y to intersect the active fins F21 and F22, and to be overlapped with one end of the active fin F23 (for example, a left end of the active fin F23 in FIG. 8).

The insulating gate IG12 may extend in the second direction Y to intersect the active fins F21 to F23.

A third device isolating layer 28 may extend in the second direction Y to achieve electrical insulation between the active fins F11 to F13 and the active fins F21 to F23.

The third device isolating layer 28 may have a lower surface formed lower than lower surfaces of the insulating gates IG11 and IG12. In particular, the lower surface of the third device isolating layer 28 may be formed lower than the upper surface of the substrate 10, and the lower surfaces of the insulating gates IG11 and IG12 may be formed higher than the upper surface of the substrate 10.

In these embodiments, the third device isolating layer 28 may have a width wider than the width of the insulating gate IG11 and the width of the insulating gate IG12.

The third device isolating layer 28 may have an upper surface formed lower than the upper surfaces of the active fins F11 to F13 and upper surfaces of the active fins F21 to F23.

In these embodiments, the dummy gates DG12 and DG13 may be formed on the third device isolating layer 28. In particular, the dummy gate DG12 may be partially overlapped with the active fins F11 and F12, and partially overlapped with the third device isolating layer 28. The dummy gate DG13 may be partially overlapped with the active fins F21 and F22, and partially overlapped with the third device isolating layer 28.

In other words, in these embodiments, the dummy gate DG12, the dummy gate DG13 and the third device isolating layer 28 may be used as a double diffusion break for electrical insulation between the active fins F11 and F12 and the active fins F21 and F22.

Meanwhile, the insulating gate IG11 may extend into the active fins F11 to F13 so as to be used as a single diffusion break for electrically insulating a semiconductor element formed on the active fins F11 to F13. Furthermore, the insulating gate IG12 may extend into the active fins F21 to F23 so as to be used as a single diffusion break for electrically insulating a semiconductor element formed on the active fins F21 to F23.

Figure 10:
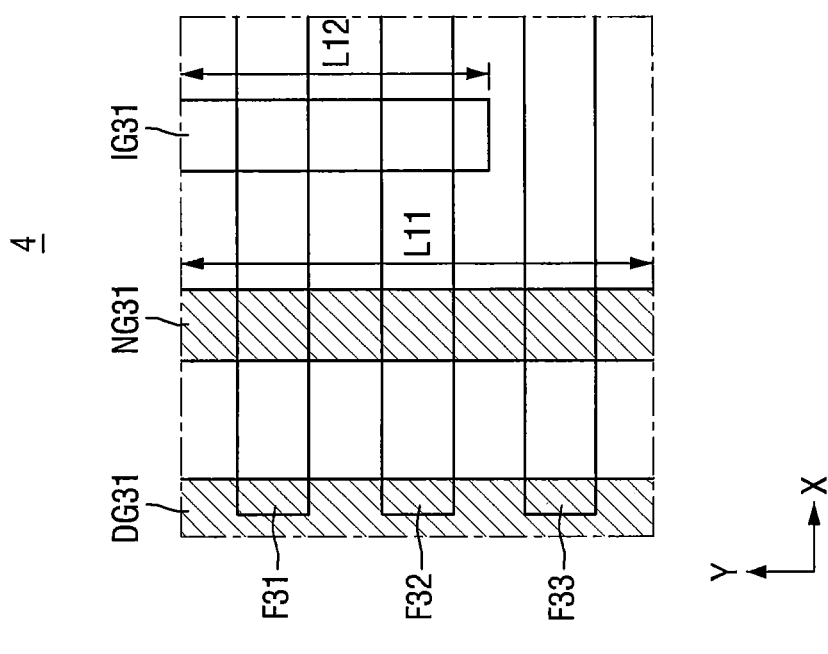
FIG. 10 is a layout diagram of a semiconductor device according to some embodiments of the present inventive concept.

FIG. 10 is a layout diagram of a semiconductor device according to some embodiments of the present inventive concept. Like numerals refer to like elements throughout. Thus, only differences between these embodiments and the aforementioned embodiments will be discussed in the interest of brevity.

Referring to FIG. 10, a semiconductor device 4 according to these embodiments may include active fins F31 to F33, a dummy gate DG31, a normal gate NG31 and an insulating gate IG31.

As illustrated in the figures, the active fins F31 to F33 may be spaced apart from each other in the second direction Y and extend in the first direction X. In these embodiments, longer sides of the active fins F31 to F33 may have the same length.

The dummy gate DG31 may extend in the second direction Y to be overlapped with one end of each of the active fins F31 to F33 (for example, a left end of each of the active fins F31 to F33 in FIG. 10).

The normal gate NG31 may extend in the second direction Y to intersect the active fins F31 to F33.

The insulating gate IG31 may extend in the second direction Y to intersect the active fins F31 and F32. The insulating gate IG31 may not intersect the active fin F33. Thus, a length L11 of the normal gate NG31 measured in the second direction Y and a length L12 of the insulating gate IG31 measured in the second direction Y may be different from each other. In particular, the length L11 of the normal gate NG31 may be longer than the length L12 of the insulating gate IG31.

Since the insulating gate IG31 has the above-described shape, the insulating gate 1031 may electrically insulate the normal gate NG31 from another adjacent semiconductor element in the active fins F31 and F32, but not in the active fin F33.

Figure 11:
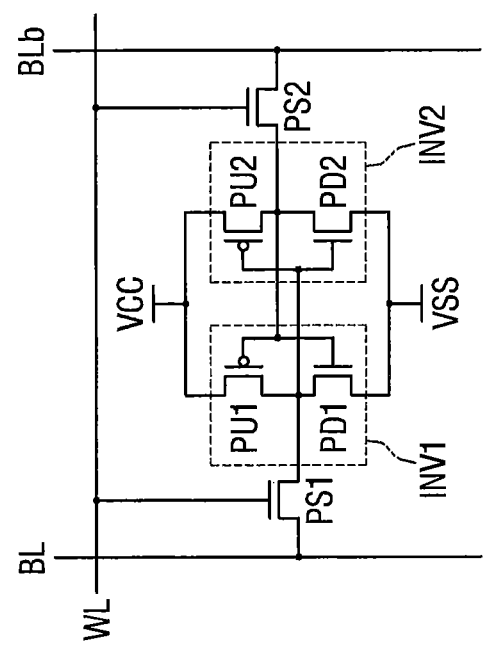
FIG. 11 is a circuit diagram illustrating a semiconductor device according to some embodiments of the present inventive concept.
Figure 12:
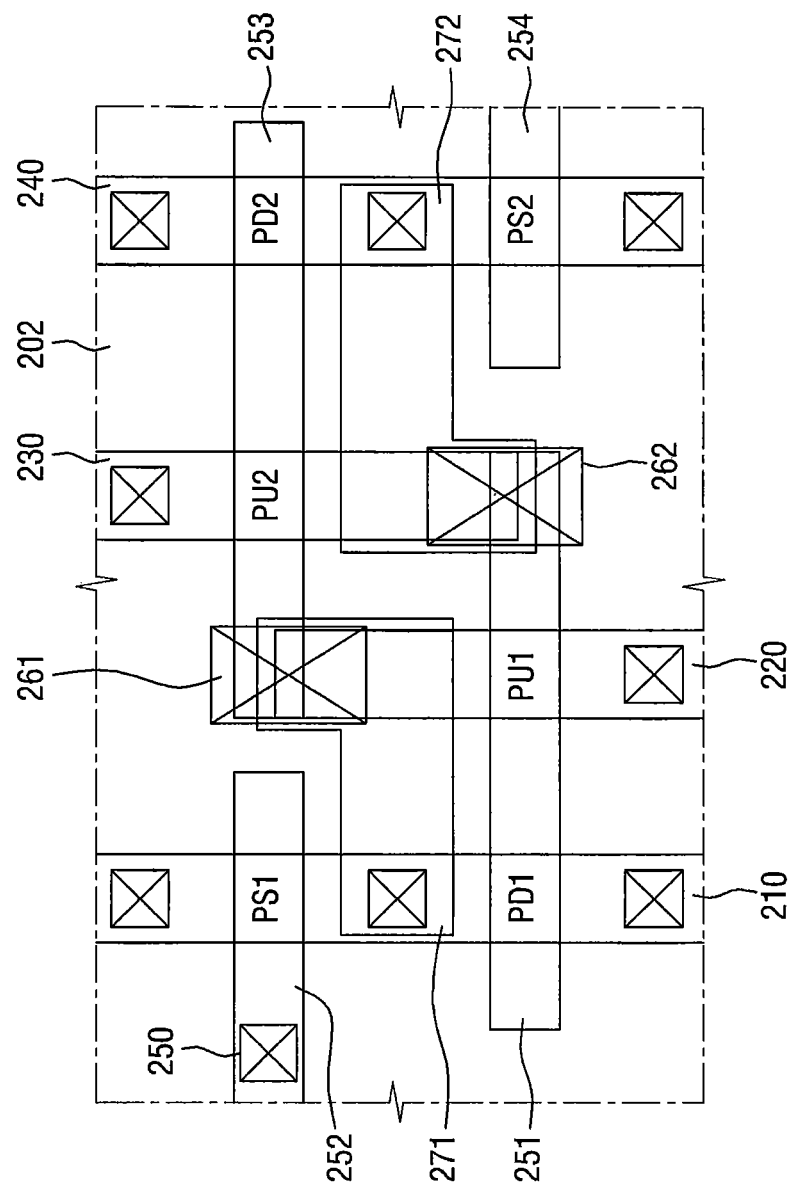
FIG. 12 is a layout diagram of the semiconductor device of FIG. 11.

FIG. 11 is a circuit diagram illustrating a semiconductor device according to some embodiments of the present inventive concept. FIG. 12 is a layout diagram of the semiconductor device of FIG. 11.

Referring to FIG. 11, the semiconductor device may include a pair of inverters INV1 and INV2 connected in parallel between a power node Vcc and a ground node Vss, and a first pass transistor PS1 and a second pass transistor PS2 connected to the respective output nodes of the inverters INV1 and INV2. The first pass transistor PS1 and the second pass transistor PS2 may be connected to the respective bit line 13L and complementary bit line BLb. Gates of the first pass transistor PS1 and second pass transistor PS2 may be connected to a word line WL.

The first inverter INV1 may include a first pull-up transistor PU1 and a first pull-down transistor PD1 connected in series, and the second inverter INV2 may include a second pull-up transistor PU2 and a second pull-down transistor PD2 connected in series. The first pull-up transistor PU1 and the second pull-up transistor PU2 may be a PFET transistor, and the first pull-down transistor PD1 and the second pull-down transistor PD2 may be an NFET transistor.

Furthermore, an input node of the first inverter INV1 is connected to the output node of the second inverter INV2 and an input node of the second inverter INV2 is connected to the output node of the first inverter INV1 so as to construct a single latch circuit.

Figure 20:
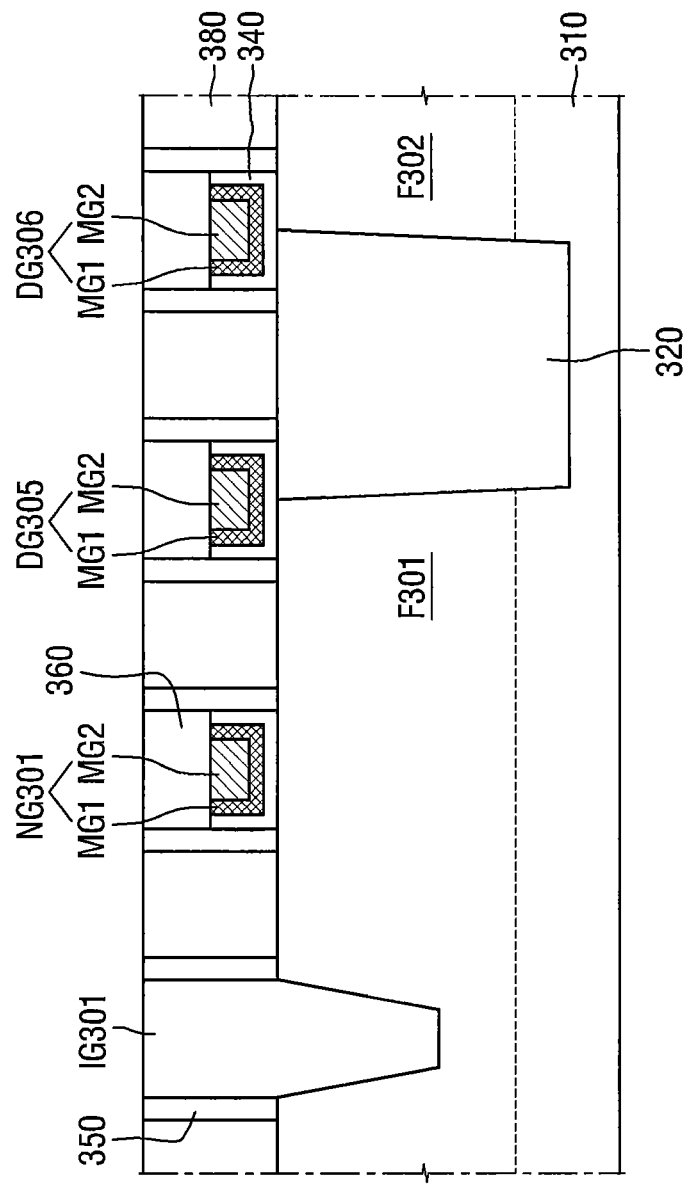

Referring to FIGS. 11 and 12, a first active fin 210, a second active fin 220, a third active fin 230 and a fourth active fin 240, which are spaced apart from each, other may extend in one direction (for example, a vertical direction in FIG. 20). The extended lengths of the second active fin 220 and the third active fin 230 may be shorter than those of the first active fin 210 and the fourth active fin 240.

A first gate electrode 251, a second gate electrode 252, a third gate electrode 253 and a fourth gate electrode 254 may extend in the other direction (for example, a horizontal direction in FIG. 20) to intersect the first to fourth active fins 210 to 240. In particular, the first gate electrode 251 may completely intersect the first active fin 210 and the second active fin 220, and may be partially overlapped with an end of the third active fin 230. The third gate electrode 253 may completely intersect the fourth active fin 240 and the third active fin 230, and may be partially overlapped with an end of the second active fin 220. The second gate electrode 252 and the fourth gate electrode 254 may be formed to intersect the respective first active fin 210 and fourth active fin 240.

As illustrated in the figures, the first pull-up transistor PU1 may be defined near a region in which the first gate electrode 251 and the second active fin 220 intersect each other, the first pull-down transistor PD1 may be defined near a region in which the first gate electrode 251 and the first active fin 210 intersect each other, and the first pass transistor PS1 may be defined near a region in which the second gate electrode 252 and the first active fin 210 intersect each other. The second pull-up transistor PU2 may be defined near a region in which the third gate electrode 253 and the third active fin 230 intersect each other, the second pull-down transistor PD2 may be defined near a region in which the third gate electrode 253 and the fourth active fin 240 intersect each other, and the second pass transistor PS2 may be defined near a region in which the fourth gate electrode 254 and the fourth active fin 240 intersect each other.

Although not clearly shown in the drawings, sources/drains and contacts 250 may be formed at both sides of each of regions in which the first to fourth gate electrodes 251 to 254 and the first to fourth active fins 210 to 240 intersect each other.

Furthermore, a first shared contact 261 may interconnect the second active fin 220, the third gate line 253 and a wiring 271 together. A second shared contact 262 may interconnect the third active fin 230, the first gate line 251 and a wiring 272 together.

At least one of the semiconductor devices discussed above according to embodiments of the present inventive concept discussed above may be used in such an SRAM layout.

Figure 13:
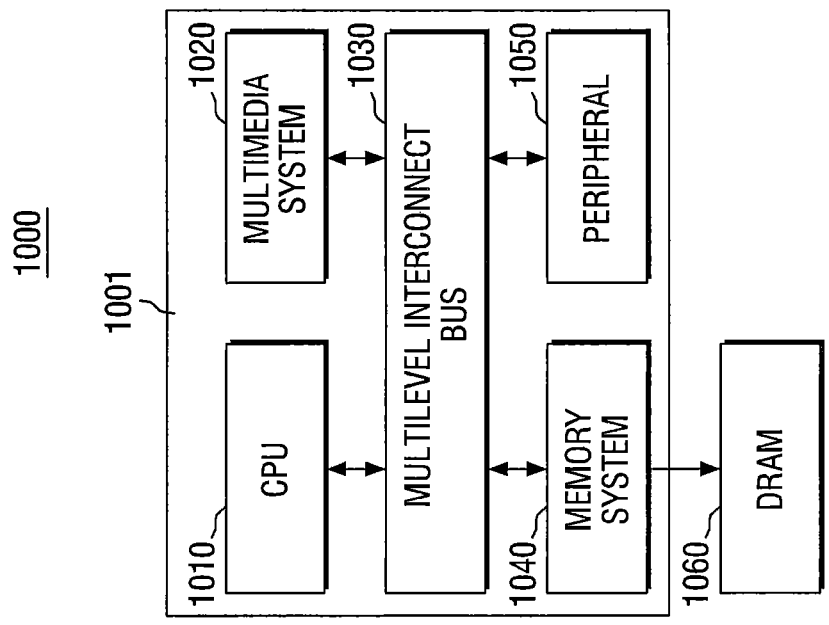
FIG. 13 is a block diagram of an SoC system including the semiconductor devices according to embodiments of the present inventive concept.

FIG. 13 is a block diagram of an SoC system including the semiconductor devices according to some embodiments of the present inventive concept. Referring to FIG. 13, an SoC system 1000 may include an application processor 1001 and a DRAM 1060.

The application processor 1001 may include a central processing unit 1010, a multimedia system 1020, a bus 1030, a memory system 1040 and a peripheral circuit 1050.

The central processing unit 1010 may perform an arithmetic operation required for operating the SoC system 1000. In some embodiments of the present inventive concept, the central processing unit 1010 may be configured into a multi-core environment including a plurality of cores.

The multimedia system 1020 may be used in carrying out various multimedia functions in the SoC system 1000. The multimedia system 1020 may include a 3D engine module, a video codec, a display system, a camera system, a post-processor and the like.

The bus 1030 may be used in data communication among the central processing unit 1010, the multimedia system 1020, the memory system 1040 and the peripheral circuit 1050. In some embodiments of the present inventive concept, the bus 1030 may have a multi-layer structure. In particular, an example of the bus 1030 may include a multi-layer advanced high-performance bus (AHB) and a multi-layer advanced extensible interface (AXI), however, the present inventive concept is not limited thereto.

The memory system 1040 may provide an environment required to enable the application processor 1001 to be connected to an external memory (for example, DRAM 1060) and to be operated at high speed. In some embodiments of the present inventive concept, the memory system 1040 may include a separate controller (for example, a DRAM controller) for controlling an external memory (for example, DRAM 1060).

The peripheral circuit 1050 may provide an environment required to enable the SoC system 1000 to be smoothly connected to an external device (for example, a main board). Accordingly, the peripheral circuit 1050 may have a variety of interfaces for compatibility of an external device connected to the SoC system 1000.

The DRAM 1060 may function as an operation memory required to enable the application processor 1001 to operate. In some embodiments of the present inventive concept, the DRAM 1060 may be disposed outside the application processor 1001 as illustrated in the figures. In particular, the DRAM 1060 may be packaged with the application processor 1001 by a package on package (PoP) technology.

At least one of components of the SoC system 1000 may include at least one of the semiconductor devices 1 to 4 according to embodiments of the present inventive concept described above.

Figure 14:
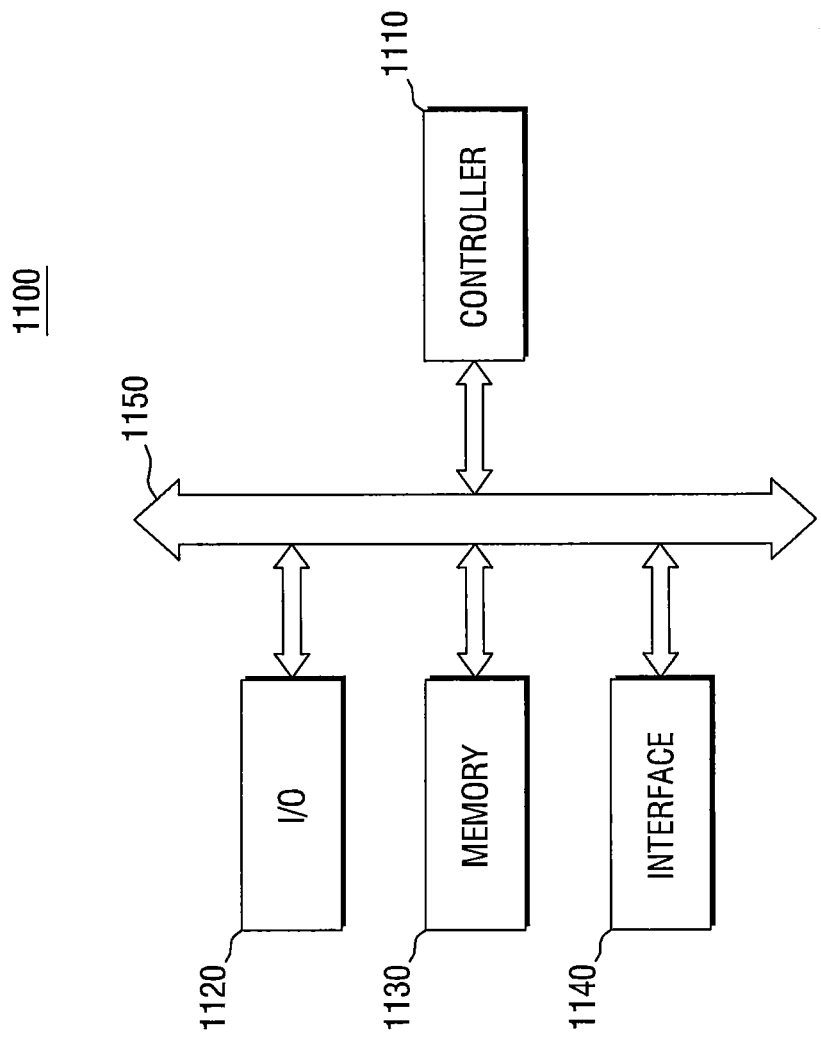
FIG. 14 is a block diagram of an electronic system including the semiconductor devices according to some embodiments of the present inventive concept.

FIG. 14 is a block diagram of an electronic system including the semiconductor devices according to some embodiments of the present inventive concept. Referring to FIG. 14, an electronic system 1100 according to some embodiments of the present inventive concept may include a controller 1110, an input/output (I/O) device 1120, a memory device 1130, an interface 1140 and a bus 1150. The controller 1110, the input/output device 1120, the memory device 1130 and/or the interface 1140 may be combined through the bus 1150. The bus 1150 serves as a path for movement of data.

The controller 1110 may include at least one of a microprocessor, a digital signal processor, a microcontroller and logic elements capable of performing a function similar to the functions of the microprocessor, the digital signal processor and the microcontroller. The input/out device 1120 may include a keypad, a keyboard, a display and the like. The memory device 1130 may store therein data and/or instructions and the like. The interface 1140 may perform a function of transmitting data to a communication network or receiving data from the communication network. The interface 1140 may be wired or wireless. For example, the interface 1140 may include an antenna, a wired/wireless transceiver or the like.

Although not shown in the drawings, the electronic system 1100 is an operation memory for enhancing the operation of the controller 1110, and may further include a high speed DRAM and/or SRAM and the like.

The semiconductor devices discussed above according to some embodiments of the present inventive concept may be provided in the memory device 1130 or provided as a part of the controller 1110, the input/output device 1120 and the like.

The electronic system 1100 may be applied to a personal digital assistant (PDA), a portable computer, a web tablet, a wireless phone, a mobile phone, a digital music player, a memory card or any electronic product that can transmit and/or receive information under a wireless environment.

Figure 15:
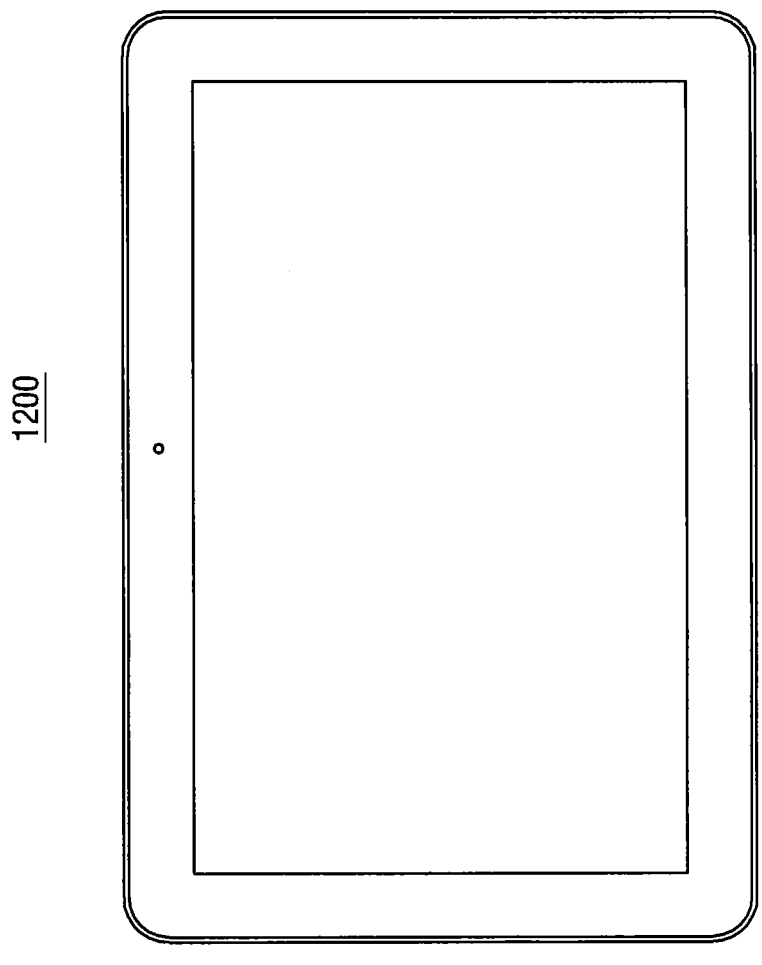
FIGS. 15 to 17 are diagrams illustrating semiconductor systems that may include semiconductor devices according to embodiments of the present inventive concept.
Figure 16:
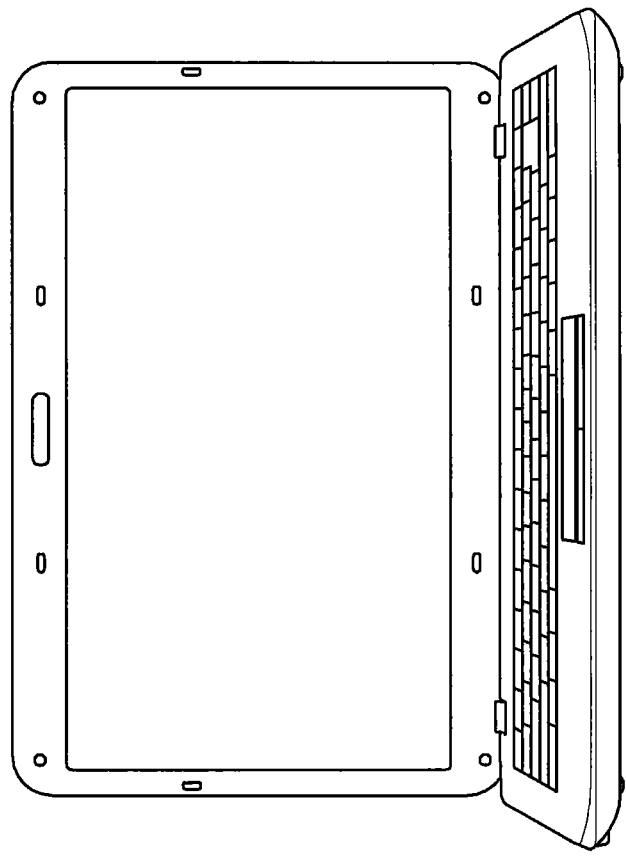
Figure 17:
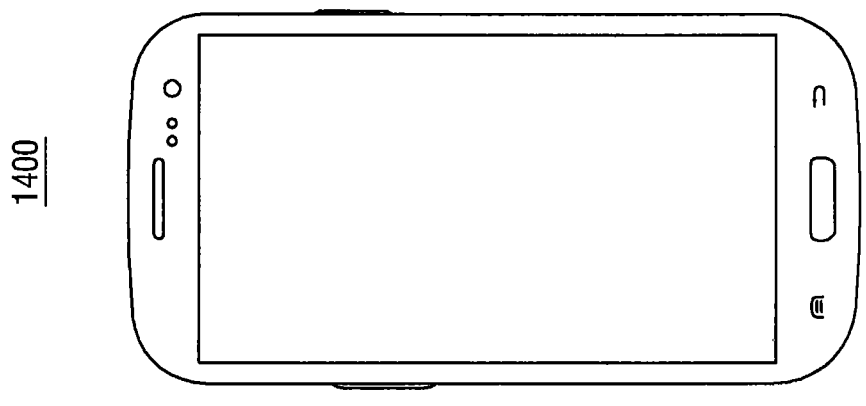

FIGS. 15 to 17 are diagrams illustrating examples of semiconductor systems to which semiconductor devices according to some embodiments of the present inventive concept can be applied.

FIG. 15 illustrates a tablet PC 1200, FIG. 16 illustrates a notebook computer 1300, and FIG. 17 illustrates a smart phone 1400. The semiconductor devices fabricated by a method for fabricating the semiconductor devices according to embodiments of the present inventive concept described above can be used in the tablet PC 1200, the notebook computer 1300, the smart phone 1400 and the like.

Furthermore, it will be apparent to those skilled in the art that the semiconductor devices fabricated by the method for fabricating the semiconductor devices according to embodiments of the present inventive concept described above can also be applied to other integrated circuit devices which are not illustrated herein without departing from the scope of the present inventive concept.

In other words, thus far, the tablet PC 1200, the notebook computer 1300 and the smart phone 1400 have been illustrated as an example of the semiconductor system according to these embodiments, however, the example of the semiconductor system according to these embodiments is not limited thereto.

In some embodiments of the present inventive concept, the semiconductor system may be realized as a computer, an ultra-mobile PC (UMPC), a workstation, a net-book, a personal digital assistant (PDA), a portable computer, a wireless phone, a mobile phone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player and the like.

Figure 18:
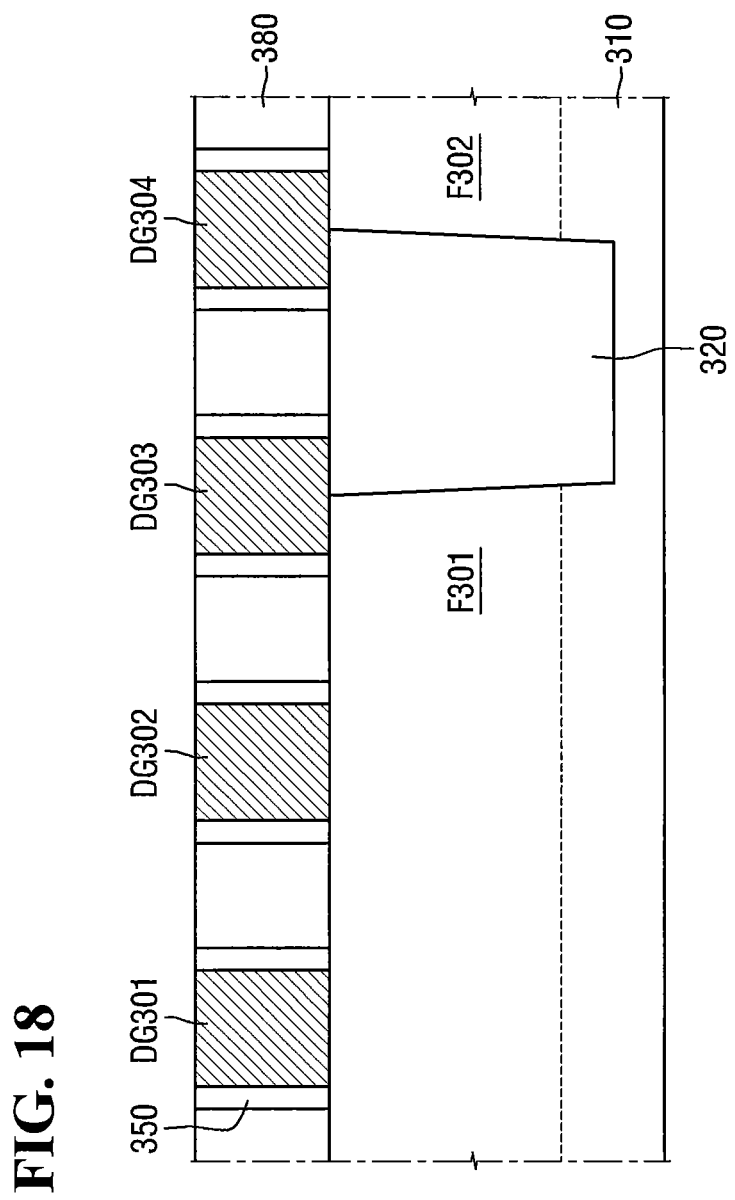
FIGS. 18 to 20 are cross sections illustrating processing steps in the fabrication of semiconductor devices according to some embodiments of the present inventive concept.
Figure 19:
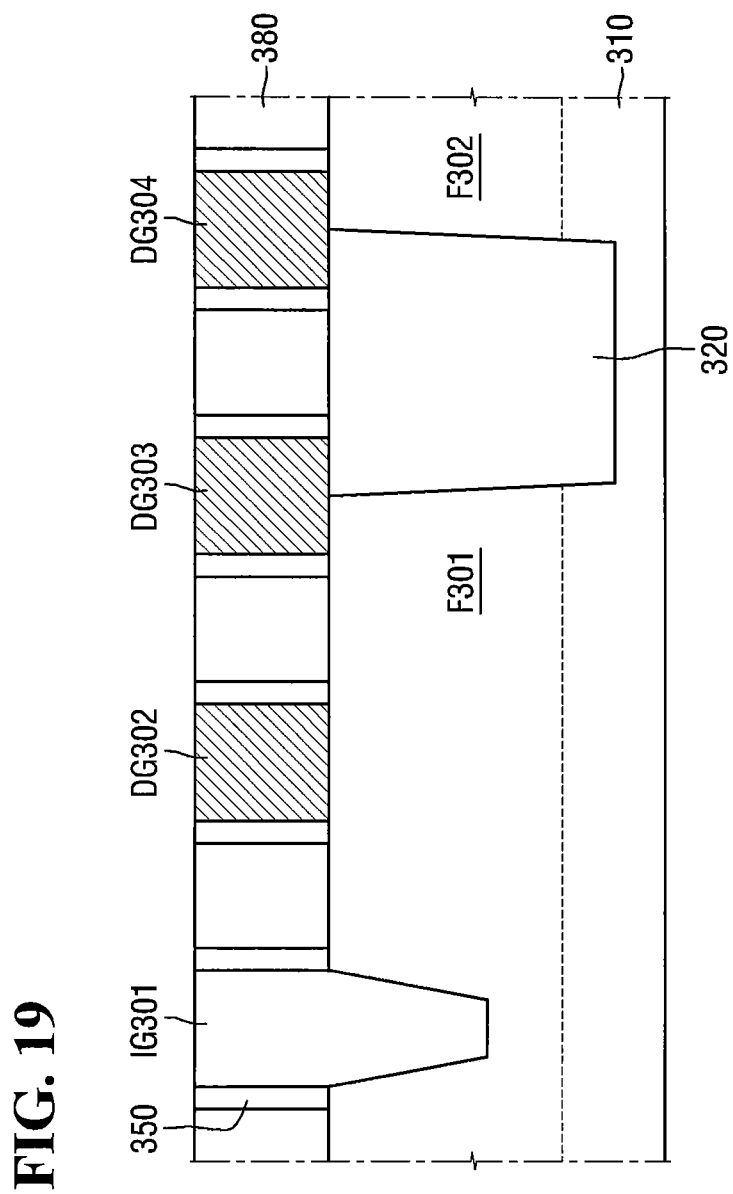

FIGS. 18 to 20 are cross-sections illustrating processing steps in the fabrication of semiconductor devices in accordance with some embodiments of the present inventive concept.

Referring first to FIG. 18, active fins are formed on a substrate 310, and a device isolating layer 320 is formed to intersect the active fins to thus isolate the active fins into a first active fin F301 and a second active fin F302.

In some embodiments of the present inventive concept, the device isolating layer 320 may have a lower surface arranged lower than an upper surface of the substrate 310 as illustrated in the figures. Furthermore, the lower surface of the device isolating layer 320 may be arranged lower than lower surfaces of the first and second active fins F301 and F302.

In some embodiments of the present inventive concept, the device isolating layer 320 may have an upper surface arranged to be substantially coplanar with upper surfaces of the first and second active fins F301 and F302. However, the present inventive concept is not limited thereto, and the upper surface of the device isolating layer 320 may be formed higher than the upper surfaces of the first and second active fins F301 and F302 as needed.

In some embodiments of the present inventive concept, the device isolating layer 320 may include an insulating film. In particular, the device isolating layer 320 may include any one of an oxide film, an oxynitride film and a nitride film, for example, however, the present inventive concept is not limited thereto.

A conductive layer including, for example, polysilicon may be formed on the first and second active fins F301 and F302 and the device isolating layer 320. The conductive layer is patterned to form dummy gates DG301 to DG304.

As illustrated in the figures, the dummy gates DG301 and DG 302 may be arranged on the first active fin F301 such that the dummy gates DG301 and DG302 intersect the first active fin F301. As illustrated in the figures, the dummy gate DG303 may be formed to be overlapped with the first active fin F301 and the device isolating layer 320. As illustrated in the figures, the dummy gate DG304 may be formed to be overlapped with the second active fin F302 and the device isolating layer 320.

Subsequently, a spacer 350 is formed on at least one side of each of the dummy gates DG301 to DG304. Although an I-type spacer 350 is depicted in the drawings, the present inventive concept is not limited thereto. In some embodiments of the present inventive concept, the spacer 350 may vary in shape without restriction.

In these embodiments, the spacer 350 may include a nitride film, for example. In particular, the spacer 350 may include a silicon nitride film.

Subsequently, an interlayer insulating layer 380 is formed to cover the spacer 350 and the dummy gates DG301 to DG304. Then, the interlayer insulating layer 380 is planarized to expose upper surfaces of the dummy gates DG301 to DG304.

In some embodiments of the present inventive concept, the interlayer insulating layer 380 may include an oxide film or a silicon oxide film, for example, however, the present inventive concept is not limited thereto.

Although not shown, a hard mask layer may be further formed on the dummy gates DG301 to DG304 in some other embodiments of the present inventive concept.

Referring now to FIG. 19, an insulating gate IG301 may be formed using a gate replacement process. In particular, the dummy gate (DG 301 in FIG. 18) is removed using the spacer 350 as a mask. In these embodiments, a part of the first active fin F301 may also be removed as illustrated in the figures. Subsequently, an insulating layer is formed in the region from which the dummy gate (DG 301 in FIG. 18) is removed, thus forming the insulating gate IG301.

In these embodiments, the insulating gate IG301 may have a lower surface formed higher than the lower surface of the device isolating layer 320. Furthermore, the lower surface of the insulating gate IG301 may be formed higher than the lower surfaces of the first and second active fins F301 and F302.

As illustrated in the figures, the insulating gate IG301 may have a width narrower than the width of the device isolating layer 320.

The insulating gate IG301 may electrically insulate the semiconductor element (for example, the normal gate NG301 in FIG. 20) formed on the first active fin F301 from another adjacent semiconductor element.

Referring now to FIG. 20, a normal gate NG01 and dummy gates DG305 and DG306 may be formed using a gate replacement process.

In particular, the dummy gates (DO 302 to DG304 in FIG. 19) are removed using the spacer 350 as a mask to as to expose the upper surfaces of the first and second active fins F301 and F302 or the upper surface of the device isolating layer 320.

A gate insulating layer 340, the first metal layer MG1 and the second metal layer MG2 are sequentially stacked on the upper surfaces of the first and second active fins F301 and F302 and on the upper surface of the device isolating layer 320 so as to form the normal gate NG01 and dummy gates DG305 and DG306.

In these embodiments, each of the normal gate NG01 and dummy gates DG305 and DG306 may include a metal gate including the first metal layer MG1 and the second metal layer MG2.

The first metal layer MG1 may serve to adjust a work function, and the second metal layer MG2 may serve to fill the space formed by the first metal layer MG1.

As illustrated in the figures, the first metal layer MG1 may be formed into a shape extending upwardly along the upper surface of the gate insulating layer 340 and side surfaces of the second metal layer MG2.

The first metal layer MG1 may include at least one of TiN, TaN, TiC, TiAlC and TaC, for example. The second metal layer MG2 may include W or Al, for example. However, the present inventive concept is not limited thereto, and the first metal layer MG1 and the second metal layer MG2 may be formed of materials different from the above-mentioned materials.

In these embodiments, an example is illustrated in which both the dummy gates DG305 and DG306 are replaced by a metal gate as in the normal gate NG301, however, the present inventive concept is not limited thereto.

The dummy gates DG305 and DG306 do not have to be replaced by a metal gate as needed. In other words, the dummy gates DG303 and DG304 shown in FIG. 19 may not be replaced during the formation of the normal gate NG301, and may be left with polysilicon contained therein.

In these embodiments, the insulating gate IG301 may be used as a single diffusion break for electrically insulating a semiconductor element formed on the first active fin F301, and the dummy gates DG305 and DG306 may be used as a double diffusion break for electrical insulation between the first active fin F301 and the second active fin F302.

For example, the interlayer insulating layer 70, the source/drain region 30, the silicide layer 32 and the contact 34 shown in FIG. 4 may be formed to obtain the semiconductor devices according to embodiments of the present inventive concept discussed above.

Although the upper surface of the device isolating layer 320 is depicted in FIGS. 18 to 20 as being arranged at the substantially same height as the upper surfaces of the first and second active fins F301 and F302, the upper surface of the device isolating layer 320 may be formed lower than the upper surfaces of the first and second active fins F301 and F302 as discussed above. In these embodiments, lower surfaces of the dummy gates DG305 and DG306 may be formed lower than the upper surfaces of the first and second active fins F301 and F302.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
a first active fin extending in a first direction;
a second active fin, spaced apart from the first active fin in a second direction perpendicular to the first direction, the second active fin extending in the first direction and having a longer side that is shorter than a length of a longer side of the first active fin, wherein the first and second active fins overlap in the second direction;
a first dummy gate extending in the second direction overlapping with a first end of each of the first and second active fins;
a first metal gate extending in the second direction intersecting the first active fin and overlapping with a second end of the second active fin; and
a first insulating gate extending in the second direction intersecting the first and second active fins, respectively,
wherein the first insulating gate extends into the first active fin;
a third active fin spaced apart from the first active fin the first direction, the third active fin extending in the first direction;
a second dummy gate extending in the second direction overlapping the second end of the first active fin; and
a third dummy gate extending in the second direction overlapping the first end of the third active fin.

2. The semiconductor device of claim 1, wherein a first pitch between the first insulating gate and the first metal gate and a second pitch between the first metal gate and the first dummy gate are different.

3. The semiconductor device of claim 2, wherein the second pitch is larger than the first pitch.

4. The semiconductor device of claim 1, wherein the first insulating gate intersects the second active fin.

5. The semiconductor device of claim 1, further comprising:
a fourth active fin spaced apart from the second active fin in the first direction, the fourth active fin extending in the first direction, the fourth active fin having a longer side that is shorter than a length of a longer side of the third active fin; and
a second metal gate extending in the second direction to intersect the third active fin and overlapping the first end of the fourth active fin.

6. The semiconductor device of claim 5, further comprising a second insulating gate extending in the second direction intersecting the third and fourth active fins.

7. A semiconductor device comprising:
a first active fin extending in a first direction;
a second active fin spaced apart from the first active fin in the first direction, the second active fin extending in the first direction;
a third active fin spaced apart from the first active fin in a second direction, the third active fin extending in the first direction;
a first dummy gate extending in the second direction perpendicular to the first direction overlapping with a first end of the first active fin, wherein the first dummy gate does not overlap with the third active fin;
a second dummy gate extending in the second direction overlapping a second end of the second active fin facing the first end of the first active fin;
a first normal gate extending in the second direction intersecting the first active fin;
a first insulating gate extending in the second direction intersecting the first and third active fins, respectively;
a second normal gate extending in the second direction intersecting the second active fin; and
a second insulating gate extending in the second direction intersecting the second active fin,
wherein the first insulating gate extends into the first active fin, and the second insulating gate extends into the second active fin, wherein the first and third active fins overlap in the second direction.

8. The semiconductor device of claim 7,
wherein either the first normal gate or the first insulating gate overlaps the first end of the third active fin; and
wherein the first dummy gate does not overlap the third active fin.

* * * * *